United States Patent
Peter et al.

(10) Patent No.: US 6,439,927 B1
(45) Date of Patent: Aug. 27, 2002

(54) SHIELDED HOUSING FOR HOLDING ELECTRONIC COMPONENTS, PARTICULARLY ELECTRONIC AIR BAG CONTROL DEVICES

(75) Inventors: Cornelius Peter, Bühl; Harry John, Steisslingen, both of (DE)

(73) Assignee: TRW Automotive Electronics & Components GmbH & Co. KG (DE)

(*) Notice: Subject to any disclaimer, the term of this patent is extended or adjusted under 35 U.S.C. 154(b) by 0 days.

(21) Appl. No.: 09/743,150
(22) PCT Filed: Jul. 7, 1999
(86) PCT No.: PCT/DE99/02100
§ 371 (c)(1), (2), (4) Date: Mar. 12, 2001
(87) PCT Pub. No.: WO00/02431
PCT Pub. Date: Jan. 13, 2000

(51) Int. Cl.[7] ............................................. H01R 13/648
(52) U.S. Cl. ........................................................ 439/607
(58) Field of Search ..................... 439/76.1, 607–610; 174/35 R, 35 MS; 361/424, 395

(56) References Cited

U.S. PATENT DOCUMENTS

| | | | |
|---|---|---|---|
| 4,381,421 A | * 4/1983 | Coats et al. | 174/35 R |
| 5,008,487 A | * 4/1991 | Shimmyo | 174/35 R |
| 5,281,169 A | * 1/1994 | Kiat et al. | 439/607 |
| 5,473,109 A | 12/1995 | Plankl et al. | |
| 5,473,111 A | 12/1995 | Hattori et al. | |
| 5,548,083 A | * 8/1996 | Yamamoto | 174/35 R |
| 5,712,765 A | 1/1998 | Lehrmann et al. | |

FOREIGN PATENT DOCUMENTS

| | | |
|---|---|---|
| CH | 681971 A5 | 6/1993 |
| JP | 08-139484 | 5/1996 |

OTHER PUBLICATIONS

International Search Report No. PCT/DE99/02100.

* cited by examiner

*Primary Examiner*—Neil Abrams
*Assistant Examiner*—J. F. Duverne
(74) *Attorney, Agent, or Firm*—Fay, Sharpe, Fagan, Minnich & McKee, LLP

(57) ABSTRACT

The invention relates to a housing for an electronics unit, especially for an airbag control device, whereby at least the metal walls of the housing are provided with a moisture repellent coating. The inventive housing is made of bent and interconnecting sheet metal elements which are extrusion-coated with plastic on at least one side.

20 Claims, 1 Drawing Sheet

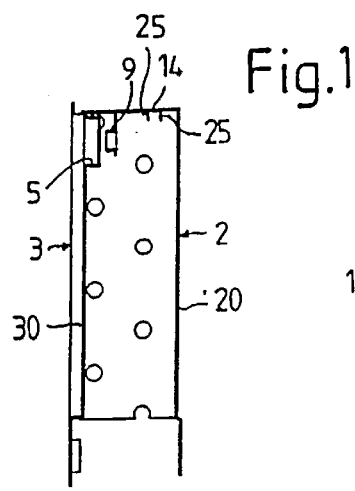
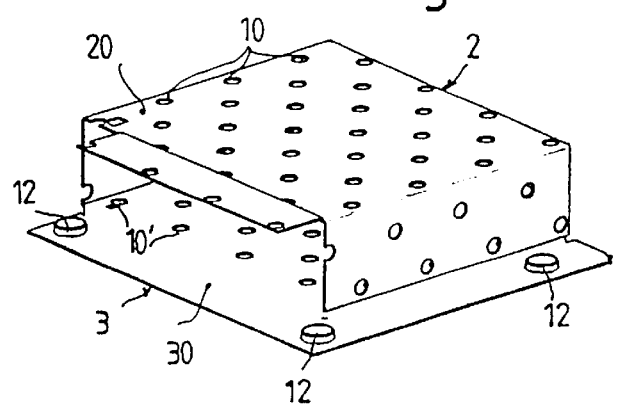
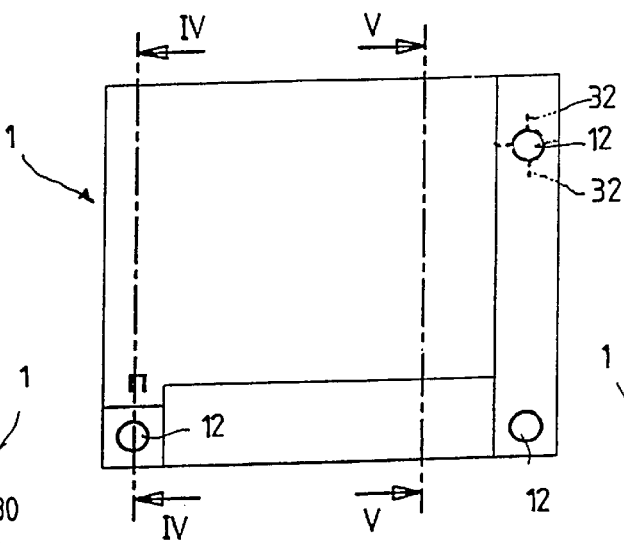
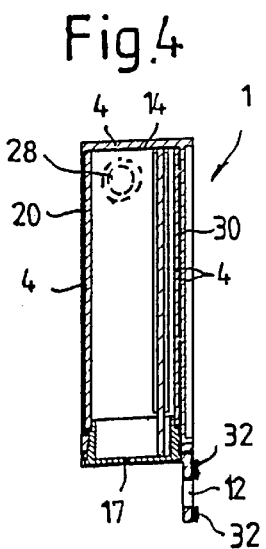
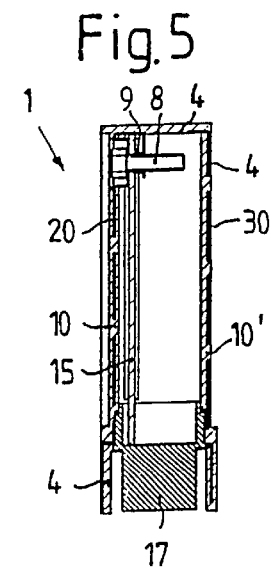

SHIELDED HOUSING FOR HOLDING ELECTRONIC COMPONENTS, PARTICULARLY ELECTRONIC AIR BAG CONTROL DEVICES

BACKGROUND OF THE INVENTION

The subject invention is directed toward the art of electronic component housings and, more particularly, to electronic air bag control housings having electromagnetic shielding metal walls provided with a moisture repellant coating. The invention is especially well suited for use with electronic air bag control devices and will be described with particular reference thereto; however, the invention is capable of a broader application and can be used for a variety of purposes in many environments.

Cast aluminum housings provided with threaded sheet metal covers have been used in the past including use in connection with air bag control devices. One disadvantage of cast aluminum housings, however, is that they offer almost no protection from moisture intrusion. For that reason, the electronics contained within the cast aluminum housings must be protected from moisture using any suitable means such as by immersion of the electronic components in an appropriate moisture repellent liquid.

Housings formed in accordance with the above prior art teachings have many drawbacks including poor electromagnetic shielding. In addition, after the printed circuit boards or other electronic components are immersed in the moisture repellent coating, repair of the electronics becomes impossible. Moreover, following the immersion step, there remains the possibility of the unwanted presence of moisture on the printed circuit board remains.

There is, therefore, the need for an electronic components housing of the type described above that is less sensitive to moisture and provides good electromagnetic shielding while also enabling repair of the electronics as necessary.

SUMMARY OF THE INVENTION

The subject invention provides an electronic components housing which provides good electromagnetic shielding, electronic component repair friendliness, and an improved moisture sensitivity. The subject housing includes a pair of bent and interconnected sheet metal elements, which are extrusion-coated at least on one side or surface thereof with a plastic covering. A bent sheet metal housing is employed according to the invention, which is subsequently extrusion-coated on one or both sides with a plastic moisture repellent covering. As a beneficial result, the housing is made water-tight. Preferably, the bent and interconnected sheet metal elements are substantially non-flexible. In that regard, any suitable substantially rigid load supporting sheet metal can be used. By means of extrusion coating the sheet metal components with plastic, it is possible to realize a wide range of functional elements in the housing including retention rails for impervious surfaces.

The housing according to the preferred embodiment of the invention is further advantageous in that the most favorable material and/or the most favorable material combination(s) is/are employed for use in the electromagnetic shielding. Preferably, a selectively insertable plug is used in combination with the housing to realize an absolutely water-tight effect. Accordingly, pre-emersion of the printed circuit board into a suitable water repellent liquid is not required. This results in the cost benefit of a reduction in the manufacturing efforts and steps required to construct the housing.

In accordance with a further aspect of the invention, ventilation of the housing is provided using a ventilation membrane.

In accordance with a yet further aspect of the invention, occluded air volume is minimized by suitably shaping the plastic material extruded onto the sheet metal component.

Still a further aspect of the invention is that subsequent repair of the electronic components within the housing remains available.

A primary object of the invention is the provision of an electronic component housing of the type described which includes one or more substantially non-flexible bent and interconnected sheet metal elements which are extrusion-coated on at least one side with a moisture repellent covering of a plastic material.

Yet another object of the invention is the provision of an electronic component housing which enables a printed circuit board or the like to be contained therein in a water-tight state without the need for pre-emersion of the printed circuit board in a water repellent liquid.

Still other advantages and benefits of the invention will become apparent to those of skilled in the art upon a reading and understanding of the following detailed description.

BRIEF DESCRIPTION OF THE DRAWINGS

The invention may take physical form in certain parts and arrangements of parts, a preferred embodiment of which will be described in detail in this specification and illustrated in the accompanying drawings which form a part hereof, and wherein:

FIG. 1 is a schematic side lateral view illustrating the sheet metal elements of the housing in an interconnected arrangement;

FIG. 2 is a perspective view of the housing shown in FIG. 1;

FIG. 3 is a top plan view of the housing illustrated in FIGS. 1 and 2;

FIG. 4 is a cross-sectional view taken along line IV—IV of FIG. 3; and,

FIG. 5 is a cross-sectional view taken along line V—V of FIG. 3.

DETAILED DESCRIPTION OF THE PREFERRED EMBODIMENT

Referring now to the drawings wherein the showings are for the purposes of illustrating the preferred embodiment of the invention only and not for purposes of limiting same, FIGS. 3–5 show the overall arrangement of a housing 1 formed in accordance with the present invention for containing electronic components, particularly electronic air bag control units. The housing 1 includes bent and interconnected sheet metal elements 2 and 3, which are extrusion-coated on at least one side or surface thereof with a moisture repellent covering of a plastic material 4. The sheet metal elements are preferably substantially non-flexible and capable of supporting electronic printed circuit boards, their mountings, and the like. In the arrangement illustrated, the housing and sheet metal elements are shaped from a plate bar.

FIGS. 1 and 2 illustrate the sheet metal elements 2 and 3 without the outer plastic coating and consisting of a housing upper part 20 and a bottom plate 30. The housing upper part 20 is formed into a shape including an upper cover plate and three side walls.

As shown in FIG. 2, the upper housing part 20 and the bottom plate 30 are provided with a plurality of spaced apart recesses 10 and 10', respectively, for embedding the extruded plastic material 4 (FIGS. 4 and 5). The plurality of recesses are adapted to receive and hold the extruded plastic material in place relative to the upper part 20 and the bottom plate 30. Preferably, the plurality of recesses are arranged on the upper housing part and the bottom plate in a continuous array or pattern as illustrated.

With continued reference to FIG. 2, the housing illustrated includes one or more areas free from plastic material on inside areas and/or outside areas of the housing which preferably function as retention rails or the like.

As is apparent from FIGS. 1 and 5, a dome 5 is formed by at least one of the sheet metal elements 2 or 3, preferably, however, the dome is formed on the bottom plate 30. In the embodiment illustrated, the dome 5 is provided in the bottom plate 30 for installation of a suitable grounding screw 8 in the housing 1 such as illustrated in FIG. 5.

With continued reference to FIGS. 1 and 5, at least one side wall 14 of the housing upper part is adapted for connection with a bushing 9. A grounding screw 8 is selectively inserted into the dome 5 and the bushing 9.

As illustrated in FIGS. 2 and 3, the bottom plate 30 of the housing includes at least one attachment opening. Preferably, however, three attachment openings 12 are provided. The upper right hand representation of the attachment opening 12 illustrated in FIGS. 3 and 4 illustrates a plurality of creases 32 formed around the attachment opening. Preferably, the creases 32 are arranged in a star-shape pattern. The creases present raised portions which penetrate oxide layers which may potentially form on mounting hardware (not shown) to thereby guarantee a safe electrical grounding connecting using the "toothed disk" technique.

It is to be noted that in accordance with the present invention, the moisture repellent covering of a plastic material can be selectively applied to one or both sides or surfaces of the bent and interconnected sheet metal elements. It is, however, essential that the front side of the attachment opening 12 and the creases 32 remain free from plastic coating covering so that a good electrical grounding connection with the housing can be made between the housing and other associated electrical components.

With reference now to FIG. 5, a printed circuit board 15 is illustrated within the housing 1. At least one electrically conductive connection is provided between the housing 1 and the printed circuit board 15. As shown, the at least one electrically conductive connection is formed by means of a plastic free retention rail 25 shown best in FIG. 1. It is to be appreciated, however, that the electrically conductive connection can also be formed as a spring contact, a screw connection, or any combination thereof. Moreover, as shown in FIG. 5, a plug 17 is selectively positioned in contact with the printed circuit board 15. The plug 17 is selectively at least partially arranged within the housing 1.

A ventilation membrane 28 is illustrated in FIG. 4. The ventilation membrane 28 is preferably arranged inside the housing by means of which ventilation of the housing is effected in a simple manner. The ventilation membrane covers a ventilation opening suitably provided in the housing. The membrane is connected to the housing using glue or the like or through a mechanical connection such as pressing the membrane into the opening.

It is to be appreciated that by extrusion-coating one or both surfaces of the sheet metal elements 2 and 3 of the housing, together with the feature of the plug 17, that the housing is made absolutely water-tight. One benefit flowing from this is that emersion of the printed circuit board 15 into a water repellent liquid is no longer required. Accordingly, the printed circuit board remains readily accessible so that subsequent repairs thereto are possible. In addition, the housing provides excellent electromagnetic shielding to electronic components contained therein. Lastly, as is evident from the drawings and the descriptions above, the housing is simple and inexpensive to manufacture.

The invention has been described with reference to the preferred embodiment. Obviously, modifications and alterations will occur to others upon a reading and understanding of this specification. It is intended to include all such modifications and alterations insofar as they come within the scope of the appended claims or the equivalents thereof.

What is claimed is:

1. A water-tight electronic component housing for use with an airbag control device, the housing comprising:

a pair of bent and interconnected sheet metal elements comprising a housing upper plate and a bottom plate, said upper plate and bottom plate each including a plurality of recesses adapted to receive a moisture repellant covering of a plastic material across a surface of each plate, said plastic material being extrusion-coated on at least one side of said upper plate and said bottom plate to form a water-tight seal.

2. The housing according to claim 1, wherein the pair of sheet metal elements are extrusion-coated with said plastic material on both sides.

3. The housing according to claim 2, wherein the sheet metal elements are shaped from a single plate bar.

4. The housing according to claim 1, wherein said plurality of recesses are arranged in a substantially continuous pattern in at least one of the housing upper part and the bottom plate.

5. The housing according to claim 3 wherein at least one of the sheet metal elements includes a plastic-free retention area on a one of an inside surface and an outside surface.

6. The housing according to claim 1 further including:

at least one dome area provided on at least one sheet metal element.

7. The housing according to claim 6, wherein:

said dome area is formed in the bottom plate for insertion of an associated grounding screw in the housing.

8. The housing according to claim 6 further including a side wall provided with a sleeve adapted to fasten with said associated grounding screw.

9. The housing according to claim 1 wherein the bottom plate further includes at least one attachment opening.

10. The housing according to claim 9, further including at least one crease formed around the attachment opening.

11. The housing according to claim 10 further including a printed circuit board disposed within said housing, at least one electrically conductive connection of the printed circuit board being electrically connected with the housing.

12. The housing according to claim 11, wherein the electrically conductive connection includes at least one of a retention rail, a spring contact, and a screw connection.

13. The housing according to claim 11, further including a plug connected with the printed circuit board, the plug being at least partially arranged in housing.

14. An electronic component housing for use with an airbag control device, comprising:

a housing upper plate and a housing lower plate each comprising a plurality of recesses extending across said upper and lower plates;

a moisture-repellant material extrusion-coated onto at least one side of said upper and lower plates, said moisture-repellant material being received within said recesses; and, a ventilation membrane arranged in the housing interior disposed between said upper plate and said lower plate.

15. The housing according to claim 14 further including:

at least one dome area provided on at least one sheet metal element.

16. The housing according to claim 15, wherein:

said dome area is formed in the bottom plate for insertion of an associated grounding screw in the housing.

17. The housing according to claim 15 further including a side wall provided with a sleeve adapted to fasten with said associated grounding screw.

18. The housing according to claim 14 wherein the bottom plate further includes at least one attachment opening.

19. The housing according to claim 18, further including at least one crease formed around the attachment opening.

20. The housing according to claim 19 further including a printed circuit board disposed within said housing, at least one electrically conductive connection of the printed circuit board being electrically connected with the housing.

* * * * *